United States Patent
Achuthan et al.

(10) Patent No.: US 6,462,409 B1
(45) Date of Patent: Oct. 8, 2002

(54) SEMICONDUCTOR WAFER POLISHING APPARATUS

(75) Inventors: Krishnashree Achuthan, San Ramon, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/876,259

(22) Filed: Jun. 6, 2001

(51) Int. Cl.$^7$ ............................................. H01L 23/14
(52) U.S. Cl. ......................... 257/702; 451/41; 451/10; 451/6; 451/66; 438/691
(58) Field of Search ........................... 257/797; 451/41, 451/6, 66, 60, 65, 4; 51/110

(56) References Cited

U.S. PATENT DOCUMENTS 5,692,947 A * 12/1997 Talieh et al. .................. 451/41
6,132,289 A * 10/2000 Labunsky et al. .............. 451/6

* cited by examiner

*Primary Examiner*—David Nelms
*Assistant Examiner*—Thao P Le
(74) *Attorney, Agent, or Firm*—Mikio Ishimaru

(57) ABSTRACT

A semiconductor wafer polishing method and apparatus therefor are provided having a system housing and a robotic handling system for moving the semiconductor wafer between a belt module and a rotary module for respective linear and rotary polishing. A buff module and a cleaning module are provided in the system housing for buffing and cleaning the semiconductor wafer.

10 Claims, 3 Drawing Sheets

SEMICONDUCTOR WAFER POLISHING APPARATUS

TECHNICAL FIELD

The present invention relates generally to polishing semiconductor wafers and more particularly conductor and barrier chemical-mechanical polishing.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "capping" layer and a "single" damascene process is completed. When the layer is processed further for placement of additional channels over it, the layer is a via stop layer.

The via formation of the dual damascene process starts with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited by electroless deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "capping" layer and the "dual" damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

Existing polishers used for conductor chemical-mechanical polishing have difficulties controlling the uniformity of the final thickness of the seed layer and conductor core. After deposition of the barrier layer and the seed layer, the electroplating process deposits conductor core material which can have a random thickness variation of up to two percent.

Rotary polishers polish the conductor material faster at the edges of the semiconductor wafer than at the center of the semiconductor wafer and produce wafer profiles that are edge thin and center thick. Thus, in order to remove all of the conductor material above the barrier layer, over-polishing is required at the edges of the semiconductor wafer. This results in a non-planar semiconductor wafer, and rejected or marginal integrated circuits at the edges of the semiconductor wafer.

Linear polishers polish the conductor material faster along the centerline of the polisher than at the outer sides which produces a semiconductor wafer which has a depression along a diameter in the direction of polishing. Thus, in order to remove all of the conductor material above the barrier layer, over-polishing is required along the diameter of the semiconductor wafer. This again results in a non-planar semiconductor wafer, and rejected or marginal integrated circuits at the centerline of the semiconductor wafer.

As wafers increase in size, the non-planarity of the semiconductor wafer becomes a greater and greater problem. The polishers by themselves, even with enhancements to the carriers which allow the polishing tools to provide variable pressure on the surface of the semiconductor wafers, still have problems providing a uniformly flat profile.

A solution to this problem has been long sought but has long eluded those skilled in the art.

DISCLOSURE OF THE INVENTION

The present invention provides a semiconductor wafer polishing method and apparatus therefor having a system housing and a robotic handling system for moving a semiconductor wafer between a belt module and a rotary module for respective linear and rotary polishing.

The present invention further provides a semiconductor wafer polishing method and apparatus therefor having a system housing and a robotic handling system for moving the semiconductor wafer between a belt module and a rotary module for respective linear and rotary polishing. A buff module and a cleaning module are provided in the system housing for buffing and cleaning the semiconductor wafer.

The present invention further provides a semiconductor wafer polishing method and apparatus therefor which produces high planarity semiconductor wafers with no contamination problems and improved channel thickness control.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
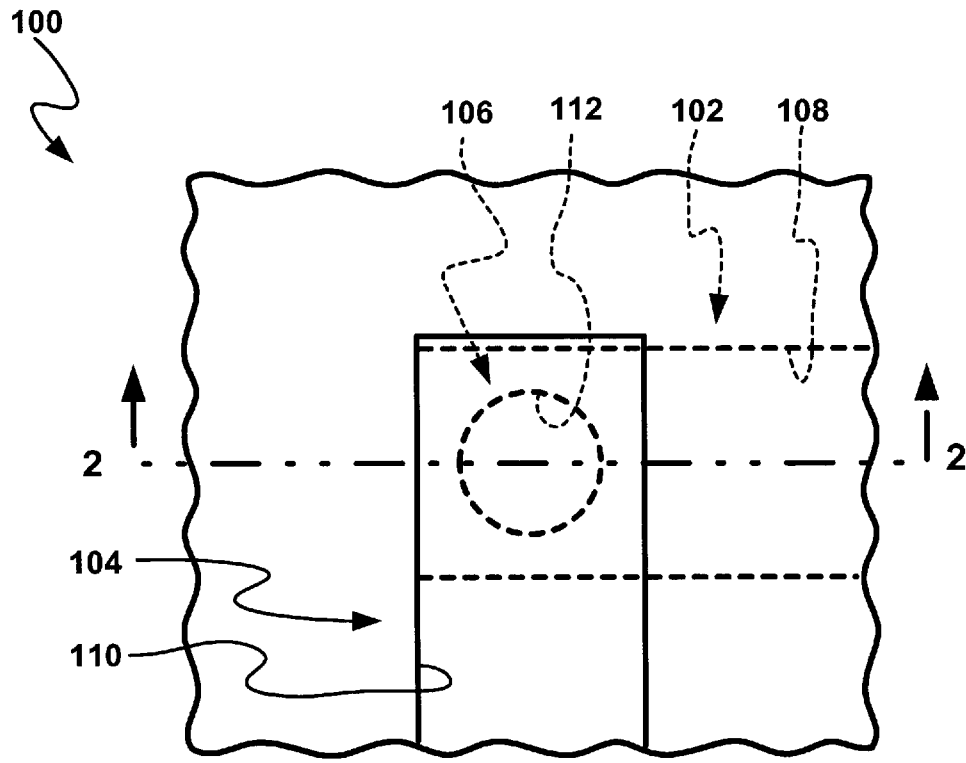
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
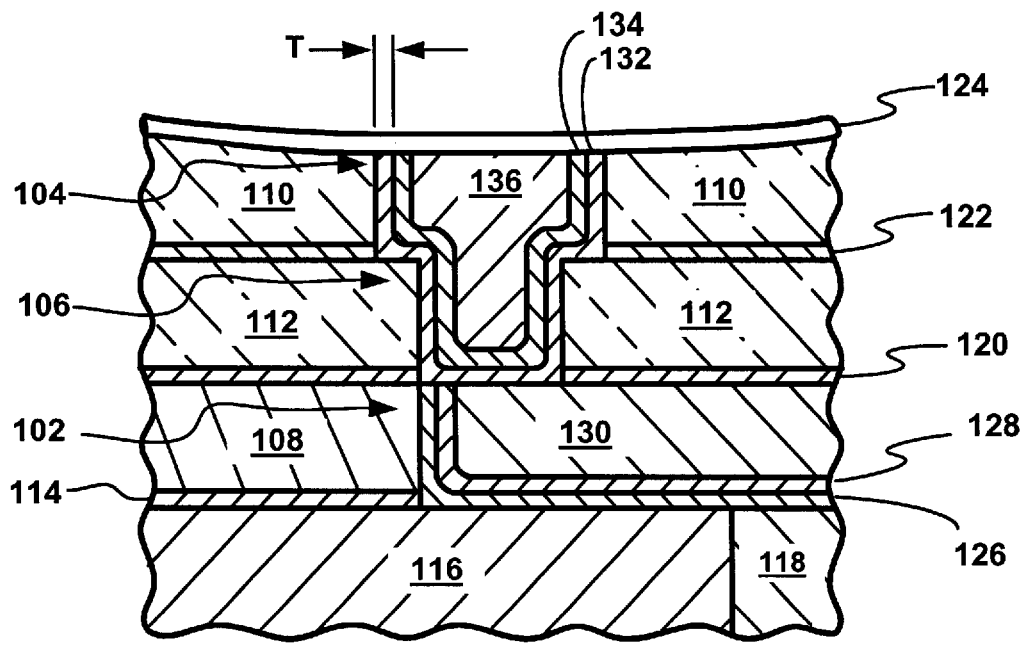
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. As shown, conventional barrier layers 126 and 132 have a thickness "T" since they are used as a chemical-mechanical polishing (CMP) stop for the CMP of the conductor cores 130 and 136. The thickness "T" is required because it is difficult to stop the CMP process at the conductor core to barrier layer interface and it is expected that some of the barrier layer will be eroded before the CMP process is able to stop. This erosion across the semiconductor wafer 100 makes the wafer non-planar.

The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

In the past, for copper conductor material and seed layers, barrier materials such as tantalum nitride (TaN), titanium nitride (TiN), or tungsten nitride (WN) were used.

Figure 3:
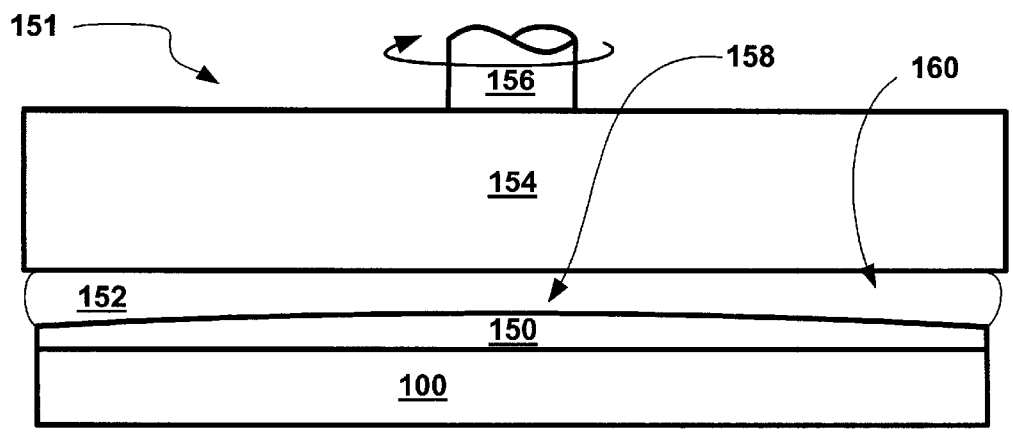
FIG. 3 (PRIOR ART) shows a step in the rotary chemical-mechanical polishing process which depicts the non-planarity of a prior art semiconductor wafer.

Referring now to FIG. 3 (PRIOR ART), therein is shown a step in the rotary CMP process of the semiconductor wafer 100 by a rotary polisher 151. The semiconductor devices (not shown), the device dielectric layer 116, the first channel stop layer 1 14, the first channel dielectric layer 108, the barrier layer 126, the seed layer 128, and the conductor core 136 have all been deposited and are generally referred to as a semiconductor wafer layer 150.

A CMP solution 152 has been deposited and is forced against the semiconductor wafer layer 150 by a polishing pad and platen 154, which is rotated by a shaft 156. The rotation of the polishing pad and platen 154 and of the CMP solution 152 causes an over-polishing of conductor core material in the region 158 near the center of the semiconductor wafer 100 and less polishing near the region 160 at the outer perimeter. For illustrative purposes, the vertical dimension of the over-polishing is exaggerated.

Figure 4:
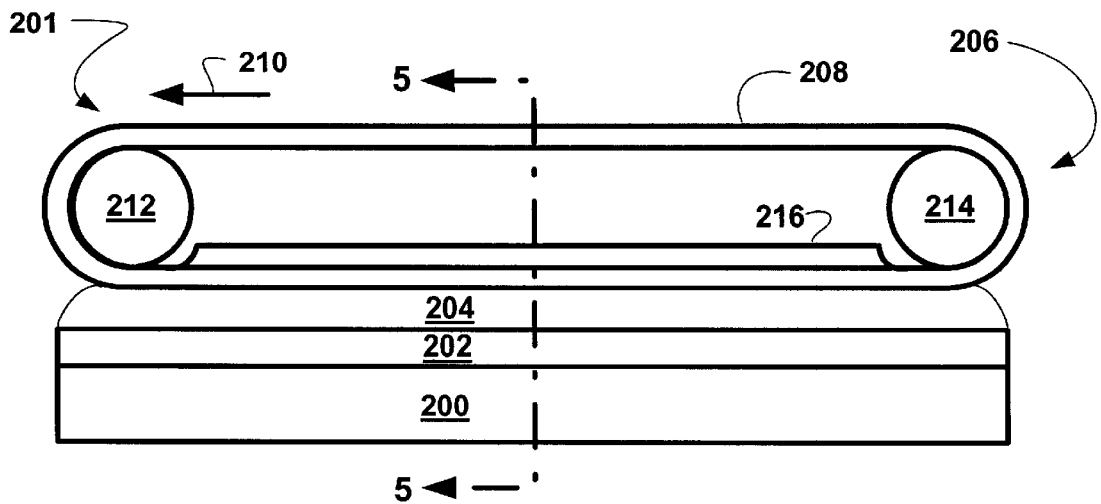
FIG. 4 (PRIOR ART) shows a prior art semiconductor wafer subject to linear chemical-mechanical polishing which depicts the edge linearity of a prior art semiconductor wafer.

Referring now to FIG. 4 (PRIOR ART), therein is shown a step in the linear CMP process of a semiconductor wafer 200 by a linear polisher 201. The semiconductor devices, the device dielectric layer, the first channel stop layer, the first channel dielectric layer, the barrier layer, the seed layer, and the conductor core have all been deposited and are generally referred to as a semiconductor wafer layer 202.

A CMP solution 204 has been deposited and is forced against the semiconductor wafer layer 202 by a polishing belt 208, which runs on a pair of rollers 212 and 214 and is backed by a pressure plate 216. The linear motion 210 of the polishing belt 208 and of the CMP solution 204 causes an over-polishing of conductor core material as will be described in FIG. 5.

Figure 5:
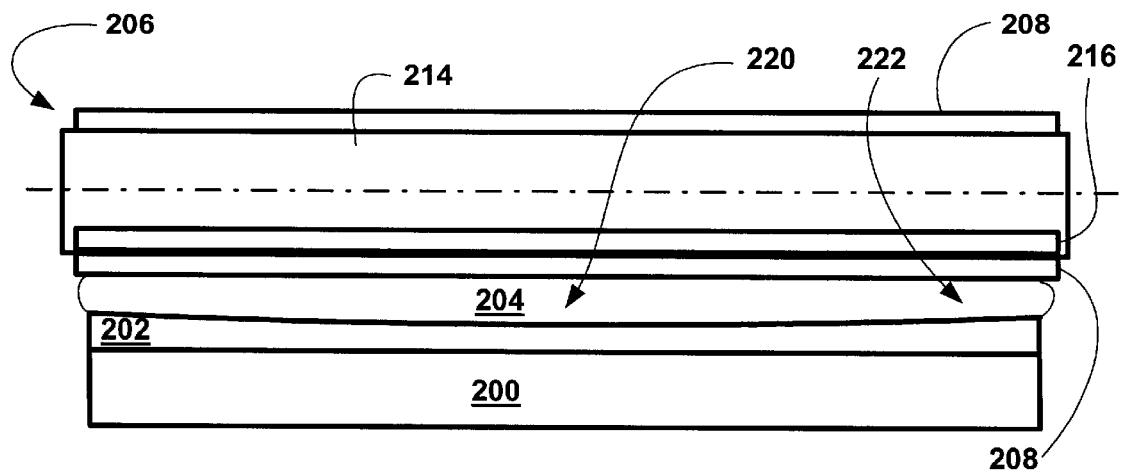
FIG. 5 (PRIOR ART) shows a cross-section of FIG. 4 (PRIOR ART) along line 5—5 which depicts the non-planarity of the prior art semiconductor wafer.

FIG. 5 (PRIOR ART) shows a cross-section of FIG. 4 (PRIOR ART) along line 5—5 which depicts the non-planarity of the prior art semiconductor wafer 200. The linear motion 210 of the polishing belt 208 and of the CMP solution 204 causes an over-polishing of conductor core material in the region 220 near the center of the semiconductor wafer 200 and less polishing near the region 222 at the outer edge. The vertical dimension of the over-polishing is exaggerated.

Figure 6:
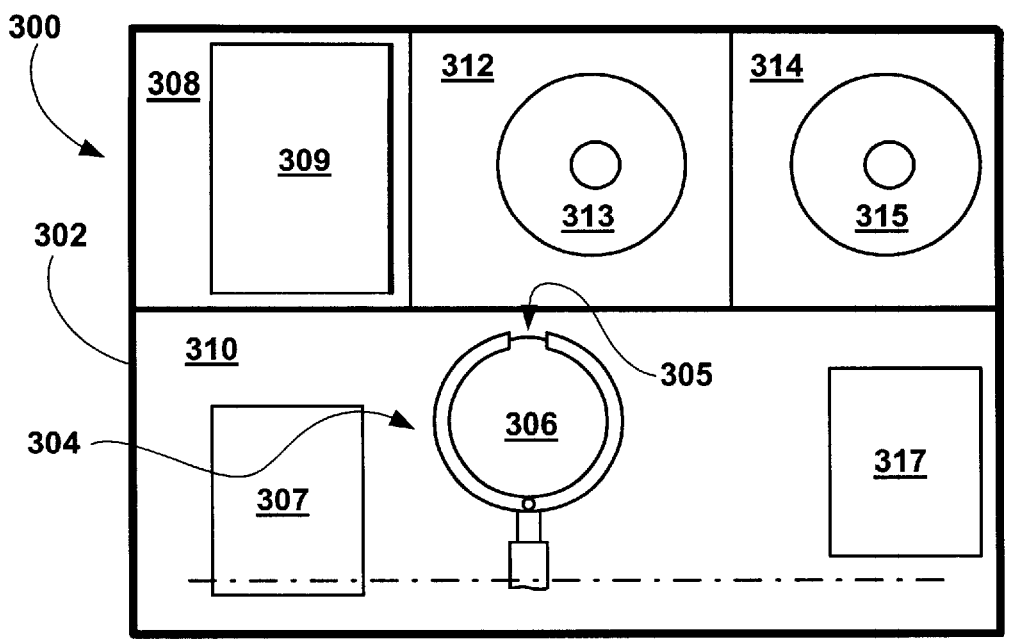
FIG. 6 shows a plan view of a semiconductor wafer polishing apparatus made in accordance with the present invention.

Referring now to FIG. 6, therein is shown a polishing system 300 for implementing the method of the present invention. The polishing system 300 includes a system housing 302 which contains a robotic wafer handling system 304. The robotic wafer handling system 304 takes a semiconductor wafer 306 not shown from a wafer boat 307 and places them in position for linear CMP of the conductor material in a belt module 308. The belt module 308 contains all the equipment necessary for linear CMP including chemicals and a linear polisher 309 not shown.

After linear polishing in the belt module 308, the semiconductor wafer 306 is moved by the robotic wafer handling system 304 to a cleaning module 310 where the CMP residue from the belt module 308 is removed.

After cleaning in the cleaning module 310, the robotic wafer handling system 304 takes semiconductor wafer 306 and places them in position for rotary CMP of the conductor material in a rotary module 312. The rotary module 312 contains all the equipment necessary for rotary CMP including chemicals and a rotary polisher 313.

After rotary polishing in the rotary module 312, the semiconductor wafer 306 is moved by the robotic wafer handling system 304 to the cleaning module 310 where the CMP residue from the rotary module 312 is removed.

After cleaning in the cleaning module 310, the robotic wafer handling system 304 takes semiconductor wafer 306 and places them in position for buffing of the conductor material in a buff module 314. The buff module 314 contains all the equipment necessary for buffing including chemicals and a rotary buffer 315.

Thus, the semiconductor wafer 306 is subject to linear CMP for removal of the conductor material above the barrier layer with no over-polishing of the center and then is cleaned. The semiconductor wafer is subject to rotary CMP for removal of the conductor material around the periphery and is then cleaned. Finally, the semiconductor wafer is buffed, cleaned, and then placed in a semiconductor wafer boat 317.

The linear and rotary CMP can be performed in any order and the system housing 302 allows all the operations to be performed without contamination of the semiconductor wafer 306. As would be evident to those skilled in the art, the polishing system 300 is not limited to semiconductor wafers but can be used anywhere planar surfaces are required on an object.

Figure 7:
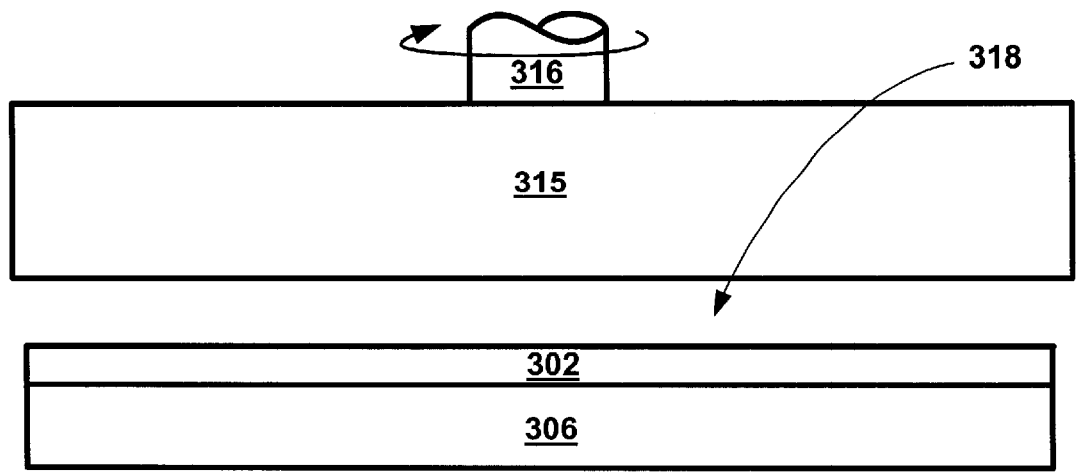
FIG. 7 shows a semiconductor wafer subject to buffing which depicts the planarity of the semiconductor wafer manufactured in accordance with the present invention in the apparatus of the present invention.

Referring now to FIG. 7, therein is shown the semiconductor wafer 306 subject to buffing by the rotary buffer 315 rotated by a shaft 316. The buffing further planarizes the semiconductor wafer layer 302 to provide the planarized surface 318. Due to the different types of erosion encountered in the different types of polishing, it was not expected that the high degree of planarity obtained would be possible.

In various embodiments, the barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric layers are of dielectric materials such as silicon oxide ($SiO_x$), tetra-ethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A wafer polishing system for a wafer comprising:

a system housing;

a belt module disposed in the system housing for linearly polishing the wafer;

a rotary module disposed in the system housing for rotary polishing the wafer; and a handling system disposed in the system housing to move the wafer between the belt and rotary modules.

2. The system as claimed in claim 1 including a cleaning module disposed in the system housing for cleaning the wafer.

3. The system as claimed in claim 1 including a buff module disposed in the system housing for buffing the wafer.

4. The system as claimed in claim 1 wherein the handling system is a robotic handling system.

5. The system as claimed in claim 1 wherein the belt module contains a plurality of airflow zones for controlling the air pressure across the wafer.

6. A semiconductor wafer polishing system for a semiconductor wafer having a conductor material over a barrier material, comprising:

a system housing;

a belt module disposed in the system housing including a linear polisher for linear chemical-mechanical polishing of the conductor material over the barrier material of the semiconductor wafer to partially remove the conductor material;

a rotary module disposed in the system housing including a rotary polisher for rotary chemical-mechanical polishing of the conductor material over the barrier material of the semiconductor wafer to remove the remaining conductor material over the barrier layer; and a wafer handling system disposed in the system housing to move the semiconductor wafer between the belt and rotary modules.

7. The system as claimed in claim 6 including a cleaning module disposed in the system housing for cleaning the semiconductor wafer between movement among the belt, rotary, and buff modules.

8. The system as claimed in claim 6 including a buff module disposed in the system housing for buffing the semiconductor wafer.

9. The system as claimed in claim 6 wherein the handling system is a robotic handling system for moving the semiconductor wafer among the belt, rotary, and buff modules and a cleaning module.

10. The system as claimed in claim 6 wherein the belt module contains a plurality of airflow zones for controlling the air pressure across the semiconductor wafer.

* * * * *